US007473973B2

(12) United States Patent
Kondo

(10) Patent No.: US 7,473,973 B2
(45) Date of Patent: Jan. 6, 2009

(54) SEMICONDUCTOR DEVICE INCLUDING METAL-OXIDE-SILICON FIELD-EFFECT TRANSISTOR AS A TRIGGER CIRCUIT

(75) Inventor: Masaki Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 11/223,131

(22) Filed: Sep. 12, 2005

(65) Prior Publication Data

US 2006/0244071 A1 Nov. 2, 2006

(30) Foreign Application Priority Data

Apr. 28, 2005 (JP) ............................ 2005-132094

(51) Int. Cl.
*H01L 27/12* (2006.01)

(52) U.S. Cl. ....................... 257/355; 257/356; 257/362; 257/546; 257/E29.014

(58) Field of Classification Search ................ 257/355, 257/356, 360–362, 546, 547, E29.008, E29.012, 257/E29.013, E29.014
See application file for complete search history.

(56) References Cited

U.S. PATENT DOCUMENTS

| | | | |
|---|---|---|---|
| 5,671,111 A | 9/1997 | Chen | |
| 5,719,733 A * | 2/1998 | Wei et al. | 361/56 |
| 5,932,916 A * | 8/1999 | Jung | 257/355 |
| 6,281,527 B1 * | 8/2001 | Chen | 257/168 |
| 2005/0275029 A1 * | 12/2005 | Watt | 257/355 |

FOREIGN PATENT DOCUMENTS

JP 9-134997 A 5/1997

OTHER PUBLICATIONS

Markus P.J. Mergens et al., "Diode-Triggered SCR (DTSCR) for RF-ESD Protection of BiCMOS SiGe HBTs and CMOS Ultra-Thin Gate Oxides," IEDM '03 Tech. Digest, 2003, pp. 21.3.1-21.3.4.

* cited by examiner

*Primary Examiner*—Matthew E Warren
(74) *Attorney, Agent, or Firm*—Foley & Lardner LLP

(57) ABSTRACT

A semiconductor device includes a silicon-controlled rectifier to protect an internal circuit from electrostatic discharge damage and a first metal-oxide-silicon field-effect transistor to apply a trigger voltage to the silicon-controlled rectifier. The first metal-oxide-silicon field-effect transistor including a gate electrode and a substrate which are electrically connected to each other.

14 Claims, 4 Drawing Sheets

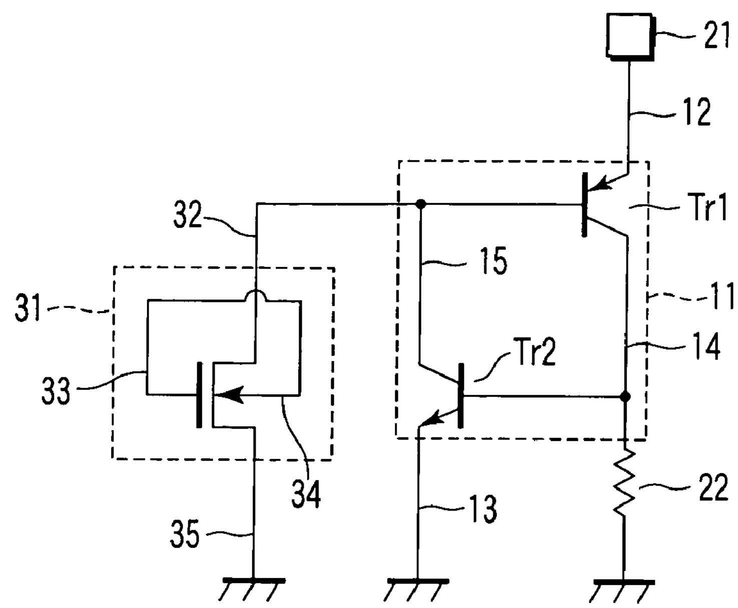
F I G. 1
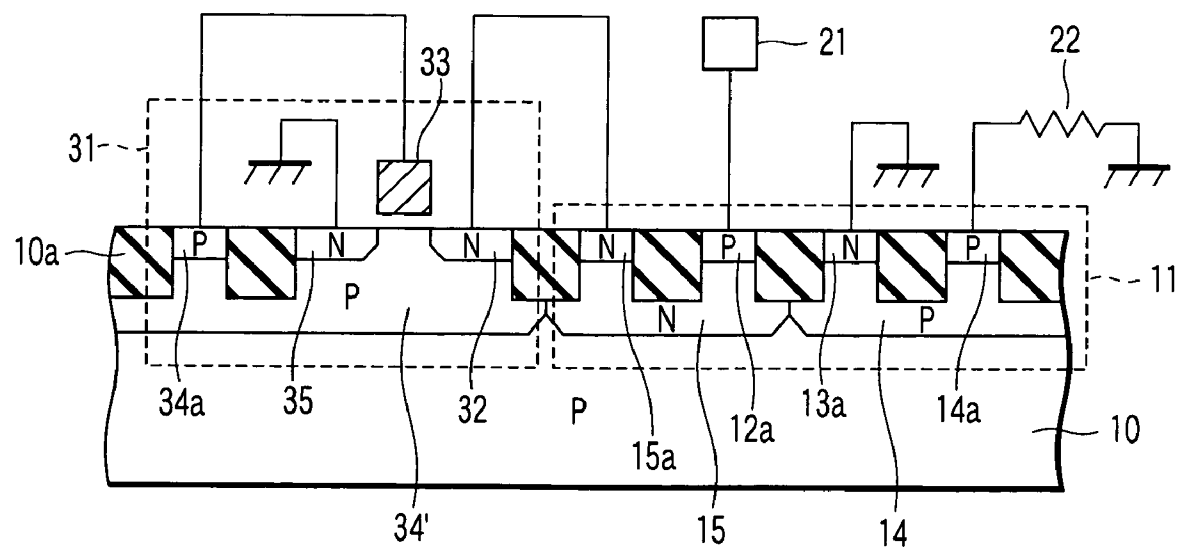
F I G. 2

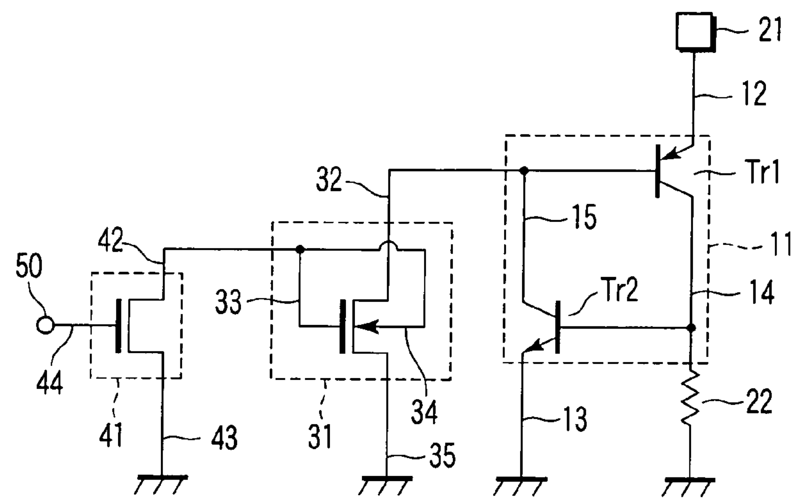
F I G. 5
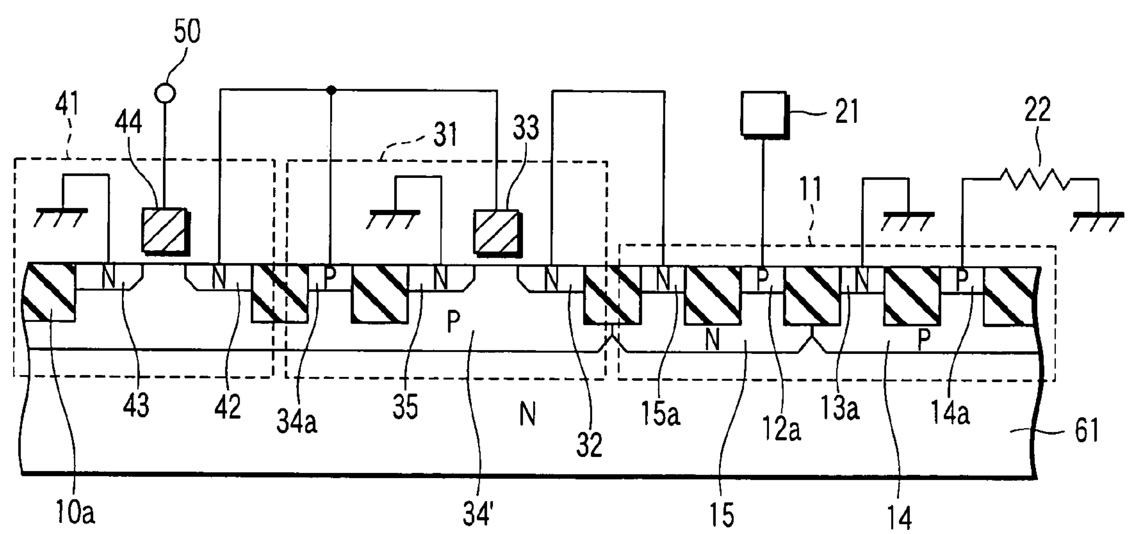
F I G. 6

SEMICONDUCTOR DEVICE INCLUDING METAL-OXIDE-SILICON FIELD-EFFECT TRANSISTOR AS A TRIGGER CIRCUIT

CROSS-REFERENCE TO RELATED APPLICATIONS

This application is based upon and claims the benefit of priority from prior Japanese Patent Application No. 2005-132094, filed Apr. 28, 2005, the entire contents of which are incorporated herein by reference.

BACKGROUND OF THE INVENTION

1. Field of the Invention

The present invention relates to a semiconductor device. More specifically, the invention relates to an electrostatic discharge (ESD) protection circuit device of a silicon-controlled rectifier (SCR) type, which has a metal-oxide-silicon field-effect transistor (MOSFET) as a trigger circuit and is used in a semiconductor integrated circuit.

2. Description of the Related Art

As is well known, it is essential to make practical use of an SCR to protect a semiconductor integrated circuit (or its internal circuit) from ESD. The SCR has the advantage that its on-resistance is extremely low. The SCR is thus suitable to protect a gate insulation film that is thinned by microfabrication of elements in the internal circuit.

On the other hand, the SCR has the disadvantage that its trigger voltage is high. The trigger voltage is called a breakdown voltage or a snapback voltage. In other words, it is an anode-to-cathode voltage generated when the SCR changes from off-state to on-state (when it is triggered). If the trigger voltage is high, the internal circuit of the semiconductor integrated circuit is easily subjected to electrostatic discharge damage. The reason is as follows. The application of an ESD surge causes a destructive stress to be applied to the gate insulation films of the elements in the internal circuit, or it causes the elements in the internal circuit to turn on earlier than the SCR and causes a destructive current to flow through a circuit board.

A number of techniques have been so far proposed to lower the trigger voltage of an SCR. For example, a prior art trigger circuit is roughly divided into two types: one using a breakdown current at a reverse-biased PN junction, and another using an on-current in a forward-biased active element.

The former trigger circuit has the advantages that its area is relatively narrow and its leakage current is small in normal circuit operation. However, it is difficult to control the breakdown voltage at the PN junction and drop the trigger voltage to a fixed level or lower.

The latter trigger circuit has the advantage that the trigger voltage can be controlled relatively easily. For example, the trigger voltage can easily be controlled by varying the number of diodes when a diode is used as an active element (see M. P. J. Mergens et al., "Diode-Triggered SCR (DTSCR) for RF-ESD Protection of BiCMOS SiGe HBTs and CMOS Ultra-Thin Gate Oxide," in IEDM '03 Tech. Digest, pp. 21.3.1-21.3.4, 2003).

Considering an ideal diode, trigger voltage Vt1 is given by the following equation:

$$Vt1=(n+1)Vbi$$

where n is the number of diodes, and Vbi is a diffusion potential at the PN junction. Vbi indicates an almost constant value (about 0.8V) that does not rely upon any process conditions. Thus, the trigger voltage Vt1 takes on discontinuous values such as 1.6V, 2.4V and 3.2V.

In general, the trigger voltage Vt1 has to be controlled to fall within a range from not lower than a power supply voltage to not higher than a breakdown voltage of a gate insulation film. This range becomes narrower as the elements in an internal circuit are microfabricated. The device disclosed in the above publication, in which the trigger voltage Vt1 takes on discontinuous values only, is unsuitable to design an ESD protection circuit device.

If the number of diodes decreases to lower the trigger voltage Vt1, leakage current increases in normal circuit operation.

A method of using a MOSFET in a trigger circuit is proposed (see Jpn. Pat. Appln. KOKAI Publication No. 9-134997). According to this method, an on-current necessary for triggering an SCR is generated by increasing the gate voltage of the MOSFET using a resistance-capacitance coupling element. In this method, a trigger voltage can finely be adjusted by controlling the threshold voltage or dimension of the MOSFET.

In the above proposed method, the resistance-capacitance coupling element has the property of blocking a signal whose frequency is $RC^{-1}$ or lower. If, therefore, a power line is connected to a terminal, the gate voltage of the MOSFET is 0V in normal circuit operation and thus leakage current is extremely small. Even though it is an input/output signal line that is connected to the terminal and the frequency of an input/output signal is higher than that (100 MHz or higher) of an ESD surge, the resistance-capacitance coupling element does not block the input/output signal. A large leakage current occurs accordingly. In order to prevent the ESD surge from attenuating, the time constant (RC product) of the resistance-capacitance coupling element has to be set to 10 ns or larger. To achieve this, a very large circuit area is required.

As described above, conventionally, an ESD protection circuit device that improves in controllability of trigger voltage and reduces in leakage current in normal circuit operation could not be decreased in size. It was therefore difficult to achieve a high-performance semiconductor integrated circuit inexpensively.

BRIEF SUMMARY OF THE INVENTION

According to a first aspect of the present invention, there is provided a semiconductor device comprising a silicon-controlled rectifier to protect an internal circuit from electrostatic discharge damage, and a first metal-oxide-silicon field-effect transistor to apply a trigger voltage to the silicon-controlled rectifier, the first metal-oxide-silicon field-effect transistor including a gate electrode and a substrate which are electrically connected to each other.

According to a second aspect of the present invention, there is provided a semiconductor device including a first metal-oxide-silicon field-effect transistor as a trigger circuit of an electrostatic discharge protection circuit device including a silicon-controlled rectifier to protect an internal circuit of a semiconductor integrated circuit, wherein the first metal-oxide-silicon field-effect transistor applies a trigger voltage to the silicon-controlled rectifier, and includes a gate electrode and a substrate which are electrically connected to each other.

According to a third aspect of the present invention, there is provided a semiconductor device comprising one of a semiconductor substrate of a first conductivity type and a first well region of the first conductivity type, a silicon-controlled rectifier provided in a surface area of one of the semiconductor substrate of the first conductivity type and the first well region of the first conductivity type, the silicon-controlled rectifier having a third well region of the first conductivity type and a first well region of a second conductivity type, the third well region of the first conductivity type being grounded through a resistance element, and the silicon-controlled rectifier having a cathode that is grounded and an anode that is connected to a terminal to which an internal circuit of a semiconductor integrated circuit is connected, and a first metal-oxide-silicon field-effect transistor provided in the surface area of one of the semiconductor substrate of the first conductivity type and the first well region of the first conductivity type in order to apply a trigger voltage to the silicon-controlled rectifier, the first metal-oxide-silicon field-effect transistor having a second well region of the first conductivity type, a gate electrode that is connected to the second well region of the first conductivity type, a source diffusion layer that is grounded, and a drain diffusion layer that is connected to the first well region of the second conductivity type of the silicon-controlled rectifier.

BRIEF DESCRIPTION OF THE SEVERAL VIEWS OF THE DRAWING

FIG. 1 is a circuit diagram showing a basic configuration of an ESD protection circuit device according to a first embodiment of the present invention;

FIG. 2 is a sectional view showing an example of a configuration of the ESD protection circuit device shown in FIG. 1;

FIG. 5 is a circuit diagram showing a basic configuration of an ESD protection circuit device according to a second embodiment of the present invention;

FIG. 6 is a sectional view showing an example of a configuration of the ESD protection circuit device shown in FIG. 5;

DETAILED DESCRIPTION OF THE INVENTION

Figure 3:
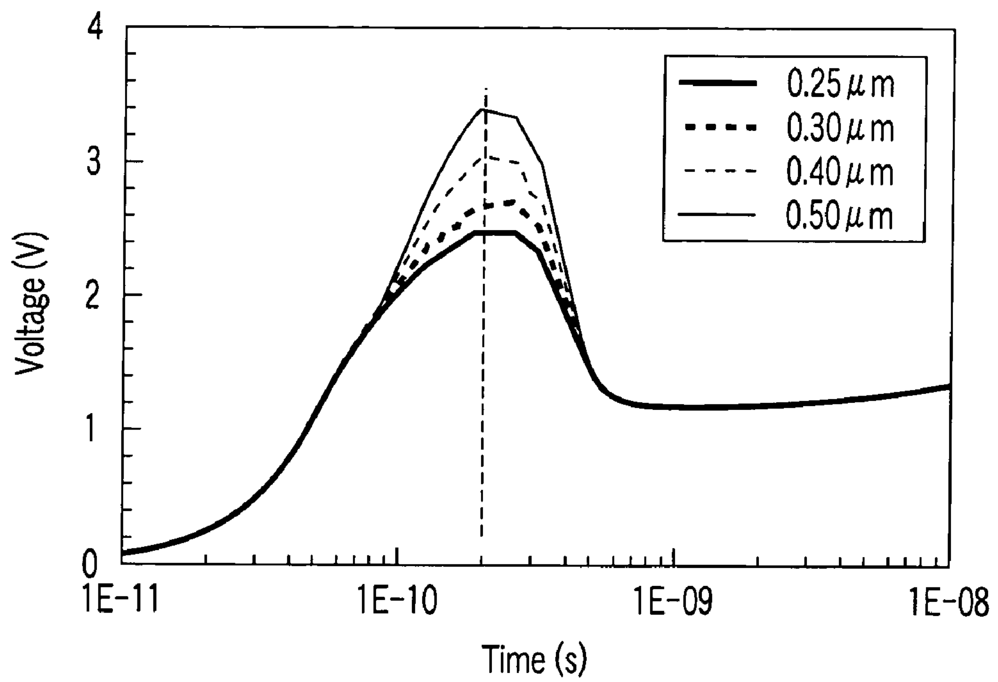
FIG. 3 is a graph of results of simulations performed by the ESD protection circuit device shown in FIG. 2.

Embodiments of the present invention will be described with reference to the accompanying drawings.

First Embodiment

FIG. 1 shows a basic configuration of an ESD protection circuit device according to a first embodiment of the present invention, which is used in a semiconductor integrated circuit. The ESD protection circuit device is of an SCR type and has a first MOSFET as a trigger circuit. In this device, the MOSFET and SCR are loaded onto a p-type semiconductor substrate (Si substrate).

Referring to FIG. 1, the SCR 11 has an anode (emitter of PNP transistor Tr1) 12 that is connected to a terminal 21. The terminal 21 is connected to an internal circuit (e.g., a power line and an input/output signal line) of a semiconductor integrated circuit (not shown). The SCR 11 also has a cathode (emitter of NPN transistor Tr2) 13 that is grounded via a power line or the like. Further, the SCR 11 has a P well region (collector of PNP transistor Tr1 and base of NPN transistor Tr2) 14 that is grounded via a resistance element (external resistor) 22 whose resistance value is about 1 KΩ.

The SCR 11 has an N well region (base of PNP transistor Tr1 and collector of NPN transistor Tr2) 15 that is connected to the drain (drain diffusion layer) 32 of an N-type MOSFET 31 serving as a trigger circuit. The gate electrode 33 and substrate (back gate) 34 of the MOSFET 31 are electrically connected to each other through a wire. Like the cathode 13 of the SCR 11, the source (source diffusion layer) 35 of the MOSFET 31 is grounded via a power line or the like.

In the first embodiment, the gate electrode 33 of the MOSFET 31 is connected to the substrate 34 and falls into a seemingly floating state. Actually, the substrate 34 of the MOSFET 31 is electrically connected to the P well region 14 of the SCR 11.

Assume that an ESD surge enters the terminal 21 in the above configuration. Current flows through the resistance element 22 and the P well region 14 of the SCR 11 increases in potential. Accordingly, the substrate 34 of the MOSFET 31 increases in potential, as does the gate electrode 33 connected thereto. If the potential of the gate electrode 33 exceeds the threshold voltage of the MOSFET 31, the MOSFET 31 is brought into conduction to cause current to flow therethrough, and the SCR 11 is triggered. In other words, the MOSFET 31 applies a given trigger voltage to the SCR 11 to bring the SCR 11 into conduction.

FIG. 2 shows a section of the ESD protection circuit device with the above-described configuration. In the first embodiment, the SCR 11 and MOSFET (trigger circuit) 31 are formed on a common p-type (first conductivity type) semiconductor substrate 10. A plurality of element isolating insulation films (element isolation regions) 10*a* are provided in the surface area of the substrate 10. The P well region (third well region of first conductivity type) 14 and N well region 15 are formed in contact with each other in the surface area of the substrate 10 and in the forming area of the SCR 11. A P-type diffusion layer 14*a* serving as a P well contact and an N type diffusion layer 13*a* serving as the cathode 13 are formed in the surface area of the P well region 14 and between the element isolating insulation films 10*a*. These layers 14*a* and 13*a* are exposed to the surface of the P-well region 14. The P-type diffusion layer 14*a* (P well region 14 of the SCR 11) is grounded via the resistance element 22, and the N-type diffusion layer 13*a* (cathode 13 of the SCR 11) is grounded.

An N-type diffusion layer 15*a* serving as an N well contact and a P-type diffusion layer 12*a* serving as the anode 12 are each formed in the surface area of the N well region 15 and between the element isolating insulation films 10*a*. The layers 15*a* and 12*a* are exposed to the surface of the N well region 15. The P-type diffusion layer 12*a* (anode 12 of SCR 11) is connected to the terminal 21.

A P well region (second well region of first conductivity type) 34' is formed in the surface area of the P-type semiconductor substrate 10 and in the forming area of the MOSFET 31. The P well region 34' is formed in contact with the N well region 15. The drain diffusion layer 32, source diffusion layer 35 and a P-type diffusion layer 34*a* serving as a substrate contact are each formed in the surface area of the P well region 34' and between the element isolating insulation film 10*a*. These layers 32, 35 and 34*a* are exposed to the surface of the region 34'. The drain and source diffusion layers 32 and 35 are separated at a given distance therebetween. The gate electrode 33 is provided on the surface of the substrate 10 between the layers 32 and 35, with a gate insulation film (not shown) between the electrode 33 and substrate 10. The gate electrode 33 is connected to the P-type diffusion layer 34*a* through a wire. The drain diffusion layer 32 is connected to the N-type diffusion layer 15*a*. The source diffusion layer 35 is grounded.

In the foregoing configuration, the P well region 34' of the MOSFET 31 and the P well region 14 of the SCR 11 are electrically connected to each other via the P-type semiconductor substrate 10. When an ESD surge is applied (power turns off), the P-type diffusion layer 34*a* of the MOSFET 31 and the P-type diffusion layer 14*a* of the SCR 11 are both biased positively. Thus, the current driving force of the MOSFET 31 increases and the turn-on time of the SCR 11 is shortened. In contrast, the potential of the P well region 14 of the SCR 11 becomes 0V in normal circuit operation (when power turns on) and thus the MOSFET 31 is always brought into nonconduction. Leakage current can thus be decreased to a low level.

The P well regions 14 and 34' can be formed at once by the same step. However, only the impurity concentration of the P well region 34' can be increased, while that of the P well region 14 remains unchanged. In this case, the ESD protection circuit device can be improved in operability without changing the triggering ease of the SCR 11.

FIG. 3 shows variations (results of simulations) of terminal voltage with time for applications of HBM (Human-Body Model) ESD surges. In the ESD protection circuit device having a section as shown in FIG. 2, the simulations are performed on the following conditions. The width of the SCR 11 and that of the MOSFET 31 are each 40 μm. The length (gate length Lg) of the gate electrode 33 of the MOSFET 31 is, for example, 0.25 μm, 0.30 μm, 0.40 μm and 0.50 μm. In FIG. 3, the vertical axis indicates a voltage at the terminal 21 and the horizontal axis indicates application time (log scale) of ESD surges.

As is apparent from FIG. 3, the trigger voltage (Vt1) varies with the gate length Lg. In other words, the trigger voltage (Vt1) increases as the gate length Lg becomes greater. Whatever the gate length Lg, the SCR 11 is triggered around 200 ps.

Figure 4:
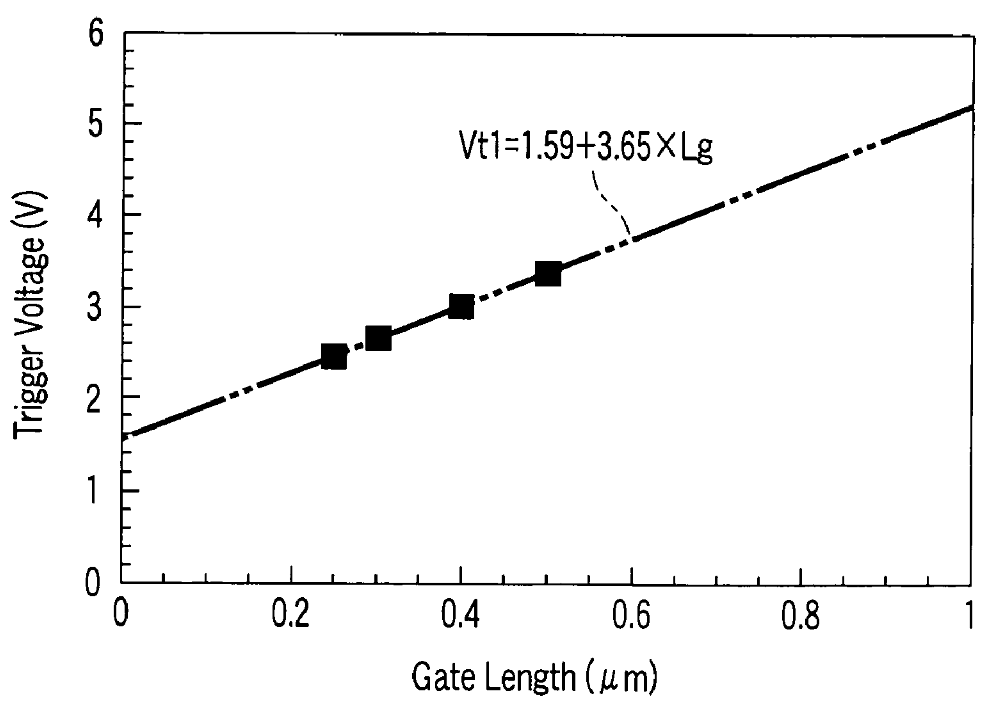
FIG. 4 is a graph showing a relationship between trigger voltage and gate length, obtained from the results of simulations shown in FIG. 3.
Figure 7:
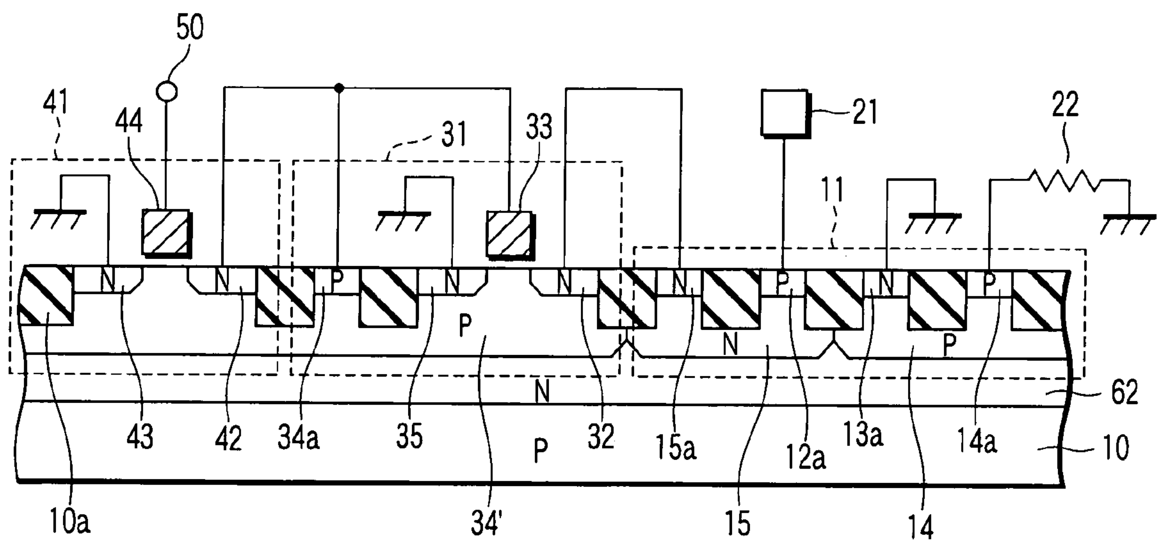
FIG. 7 is a sectional view showing another example of the configuration of the ESD protection circuit device shown in FIG. 5.

FIG. 4 shows a relationship between the trigger voltage and gate length in the results of simulations shown in FIG. 3. In the first embodiment, the trigger voltage Vt1 varies linearly with the gate length Lg. If the gate length Lg varies between 0.25 μm (actual minimum gate length) and 1.0 μm, the trigger voltage Vt1 can continuously be adjusted between about 2V and 5V.

It is favorable that the trigger voltage Vt1 at the terminal 21 be adjusted to vary by 1.0V or higher as the gate length Lg varies by 1 μm.

The trigger voltage Vt1 can be adjusted by controlling the threshold voltage (Vth) of the MOSFET 31 in place of the gate length Lg. The leakage current in normal circuit operation is 10 nA or smaller (power supply voltage 1.8V) when the power line is protected, and 10 μA or smaller (a peak value per change from OFF to ON) when the input/output signal line is protected. This is the same as that of the above M. P. J. Mergens et al. publication, and is superior to the above Jpn. Pat. Appln. KOKAI Publication (about 500 μA when the input/output signal line is protected).

In the ESD protection circuit device having a MOSFET as a trigger circuit, as described above, the gate electrode of the MOSFET and the substrate are electrically connected to each other, and the gate electrode is biased through the substrate, with the result that the MOSFET triggers the SCR. The ESD protection circuit device can be reduced in leakage current in normal circuit operation and thus decreased in size. Moreover, the ESD protection circuit device can easily be designed and simply achieved by the existing technique. In particular, the trigger voltage can easily be adjusted only by varying the length of the gate electrode of the MOSFET. The controllability of the trigger voltage is high. Consequently, a high-performance semiconductor integrated circuit can be achieved inexpensively.

Second Embodiment

FIG. 5 shows a basic configuration of an ESD protection circuit device according to a second embodiment of the present invention, which is used in a semiconductor integrated circuit. The ESD protection circuit device is of an SCR type and has a MOSFET as a trigger circuit. This device is configured to suppress a leakage current in normal circuit operation. The same components as those of FIG. 1 are indicated by the same reference numerals and their detailed descriptions are omitted.

Referring to FIG. 5, an SCR 11 has an anode (emitter of PNP transistor Tr1) 12 that is connected to a terminal 21. The terminal 21 is connected to an internal circuit (e.g., a power line and an input/output signal line) of a semiconductor integrated circuit (not shown). The SCR 11 also has a cathode (emitter of NPN transistor Tr2) 13 that is grounded via a power line or the like. Further, the SCR 11 has a P well region (collector of PNP transistor Tr1 and base of NPN transistor Tr2) 14 that is grounded via a resistance element (external resistor) 22 whose resistance value is about 1 KΩ.

The SCR 11 has an N well region (base of PNP transistor Tr1 and collector of NPN transistor Tr2) 15 that is connected to the drain (drain diffusion layer) 32 of an N-type MOSFET 31 serving as a trigger circuit. The gate electrode 33 and substrate (back gate) 34 of the MOSFET 31 are electrically connected to each other through a wire. Like the cathode 13 of the SCR 11, the source (source diffusion layer) 35 of the MOSFET 31 is grounded via a power line or the like.

The gate electrode 33 and substrate 34 of the MOSFET 31 are connected to the drain (drain diffusion layer) 42 of an N-type MOSFET 41 that is a second MOSFET. The MOSFET 41 turns off the MOSFET 31 in normal circuit operation, and its source (source diffusion layer) 43 is grounded and its gate electrode 44 is connected to a control terminal (power supply potential) 50.

The mechanism of the second embodiment for triggering the SCR 11 when an ESD surge is applied to the terminal 21 is the same as that of the first embodiment. It differs in that the gate electrode 44 of the MOSFET 41 is fixed to the power supply potential. It is thus possible to suppress a leakage current in normal circuit operation. In other words, since the potential of the gate electrode 33 of the MOSFET 31 is fixed to 0V by the MOSFET 41 when power turns on, the MOSFET 31 is placed into nonconduction at all times. The leakage current can thus be suppressed.

The above configuration is particularly favorable when the MOSFET 31 and SCR 11 are electrically isolated by an N-type (second conductivity type) semiconductor layer such as an N-type semiconductor substrate 61 and an N-type well region (double well structure) 62. Assume here that an ESD surge is applied to the terminal 21. As the potential of the terminal 21 increases, that of the N well region 15 increases through capacitive coupling of a PN junction between the anode 12 (P-type diffusion layer 12*a*) and the N well region 15. Thus, the potential of the gate electrode 33 increases through capacitive coupling between the drain diffusion layer 32 and gate electrode 33 and capacitive coupling between the drain diffusion layer 32 and substrate 34 (P well region 34'). If the potential of the gate electrode 33 exceeds the threshold voltage of the MOSFET 31, the MOSFET 31 is brought into conduction to cause on-current to flow therethrough and the SCR 11 is triggered.

The second embodiment is not limited to the above case where a leakage current can be suppressed in normal circuit operation. Even though the MOSFET 31 and SCR 11 are electrically isolated from each other by an N-type semiconductor layer (N-type semiconductor substrate 61 or N-type well region 62), the ESD protection circuit device can be decreased in size as in the first embodiment. The ESD protection circuit device can be easily designed and simply achieved by the existing technique. In particular, the trigger voltage can easily be adjusted and improved in controllability only by varying the length of the gate electrode 33 of the MOSFET 31. A high-performance semiconductor integrated circuit can be achieved inexpensively.

Needless to say, the second embodiment can be applied to the first embodiment. If the second N-type MOSFET 41 is provided in the ESD protection circuit device shown in FIG. 2, a leakage current can be suppressed in normal circuit operation.

Figure 8:
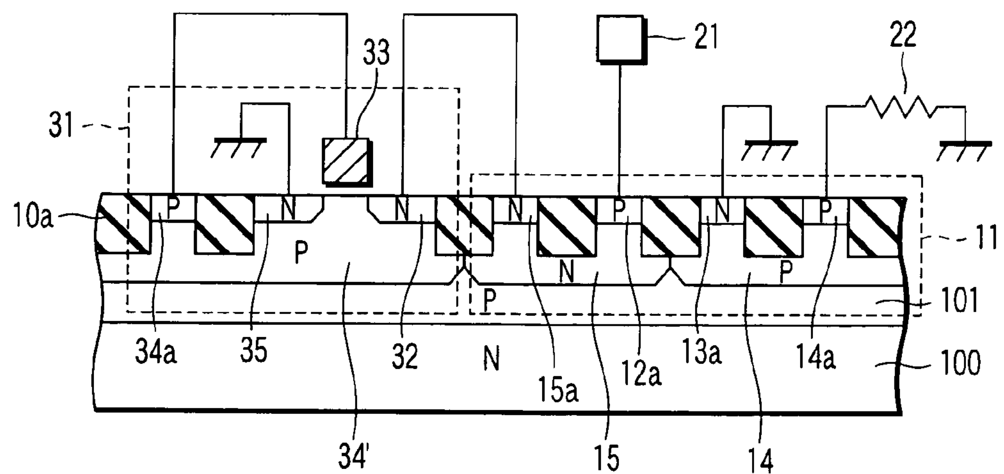
FIG. 8 is a sectional view showing another example of the configuration of the ESD protection circuit device shown in FIG. 1.

The P-type semiconductor substrate has been described as the first embodiment; however, it can be replaced with a substrate of an opposite conductivity type. As shown in FIG. 8, a P-type well region (first well region of first conductivity type) 101 is formed on an N-type semiconductor substrate (semiconductor layer of second conductivity type) 100, and the SCR circuit 11 and trigger circuit 31 are formed on the P-type well region 101. Thus, the P well region 14 of the SCR circuit 11 and the P well region 34' of the trigger circuit 31 can be brought into conduction through the P-type well region 101.

If the N-type semiconductor substrate 100 is used in the first embodiment, the trigger circuit 31 can be configured as a P-type MOSFET. In this case, all P-type elements are replaced with N-type ones, and vice versa. For example, the PNP transistor Tr1 of the SCR circuit 11 is replaced with an NPN transistor, and an NPN transistor Tr2 is replaced with a PNP transistor. Such a device operates when a negative surge is applied.

In the second embodiment, too, P-type and N-type elements can be replaced with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a silicon-controlled rectifier to protect an internal circuit from electrostatic discharge damage; and a first metal-oxide-silicon field-effect transistor to apply a trigger voltage to the silicon-controlled rectifier, the first metal-oxide-silicon field-effect transistor including a gate electrode and a substrate which are electrically connected to each other, wherein the silicon-controlled rectifier and the first metal-oxide-silicon field-effect transistor are provided on a common first well region of a first conductivity type, and the first metal-oxide-silicon field-effect transistor has a second well region of the first conductivity type, and the silicon-controlled rectifier has a third well region of the first conductivity type, the second well region of the first conductivity type and the third well region of the first conductivity type being electrically connected to each other through the first well region of the first conductivity type.

2. The semiconductor device according to claim 1, wherein the second well region of the first conductivity type has impurity concentration that is higher than that of the third well region of the first conductivity type.

3. The semiconductor device according to claim 1, wherein the first metal-oxide-silicon field-effect transistor and the silicon-controlled rectifier are electrically isolated from each other by a semiconductor layer of a second conductivity type.

4. The semiconductor device according to claim 1, further comprising a second metal-oxide-silicon field-effect transistor which is connected to the substrate and the gate electrode of the first metal-oxide-silicon field-effect transistor in order to turn off the first metal-oxide-silicon field-effect transistor in normal operation.

5. A semiconductor device including a first metal-oxide-silicon field-effect transistor as a trigger circuit of an electrostatic discharge protection circuit device including a silicon-controlled rectifier to protect an internal circuit of a semiconductor integrated circuit, wherein the first metal-oxide-silicon field-effect transistor applies a trigger voltage to the silicon-controlled rectifier, and includes a gate electrode and a substrate which are electrically connected to each other, the semiconductor device further including a second metal-oxide-silicon field-effect transistor which is connected to the substrate and the gate electrode of the first metal-oxide-silicon field-effect transistor in order to turn off the first metal-oxide-silicon field-effect transistor in normal operation.

6. The semiconductor device according to claim 5, wherein the silicon-controlled rectifier and the first metal-oxide-silicon field-effect transistor are provided on one of a common first well region of a first conductivity type and a common semiconductor substrate of the first conductivity type, and the first metal-oxide-silicon field-effect transistor has a second well region of the first conductivity type, and the silicon-controlled rectifier has a third well region of the first conductivity type, the second well region of the first conductivity type and the third well region of the first conductivity type being electrically connected to each other through one of the first well region of the first conductivity type and the semiconductor substrate of the first conductivity type.

7. The semiconductor device according to claim 6, wherein the second well region of the first conductivity type has impurity concentration that is higher than that of the third well region of the first conductivity type.

8. The semiconductor device according to claim 5, wherein the first metal-oxide-silicon field-effect transistor and the silicon-controlled rectifier are electrically isolated from each other by a semiconductor layer of a second conductivity type.

9. A semiconductor device comprising:

one of a semiconductor substrate of a first conductivity type and a first well region of the first conductivity type;

a silicon-controlled rectifier provided in a surface area of one of the semiconductor substrate of the first conductivity type and the first well region of the first conductivity type, the silicon-controlled rectifier having a third well region of the first conductivity type and a first well region of a second conductivity type, the third well region of the first conductivity type being grounded through a resistance element, and the silicon-controlled rectifier having a cathode that is grounded and an anode that is connected to a terminal to which an internal circuit of a semiconductor integrated circuit is connected; and a first metal-oxide-silicon field-effect transistor provided in the surface area of one of the semiconductor substrate of the first conductivity type and the first well region of the first conductivity type in order to apply a trigger voltage to the silicon-controlled rectifier, the first metal-oxide-silicon field-effect transistor having a second well region of the first conductivity type, a gate electrode that is connected to the second well region of the first conductivity type, a source diffusion layer that is grounded, and a drain diffusion layer that is connected to the first well region of the second conductivity type of the silicon-controlled rectifier.

10. The semiconductor device according to claim 9, wherein the second well region of the first conductivity type of the first metal-oxide-silicon field-effect transistor and the third well region of the first conductivity type of the silicon-controlled rectifier are electrically connected to each other through one of the semiconductor substrate of the first conductivity type and the first well region of the first conductivity type.

11. The semiconductor device according to claim 10, wherein the second well region of the first conductivity type has impurity concentration that is higher than that of the third well region of the first conductivity type.

12. The semiconductor device according to claim 9, wherein the first metal-oxide-silicon field-effect transistor and the silicon-controlled rectifier are electrically isolated from each other by a semiconductor layer of a second conductivity type.

13. The semiconductor device according to claim 9, further comprising a second metal-oxide-silicon field-effect transistor which is formed in the surface area of one of the semiconductor substrate of the first conductivity type and the first well region of the first conductivity type in order to turn off the first metal-oxide-silicon field-effect transistor in normal operation.

14. The semiconductor device according to claim 13, wherein the second metal-oxide-silicon field-effect transistor has a gate electrode that is connected to a power supply potential, a source diffusion layer that is grounded, and a drain diffusion layer that is connected to the gate electrode of the first metal-oxide-silicon field-effect transistor and the second well region of the first conductivity type.

* * * * *